United States Patent
Ahn et al.

(10) Patent No.: US 6,593,656 B2
(45) Date of Patent: Jul. 15, 2003

(54) MULTILEVEL COPPER INTERCONNECTS FOR ULTRA LARGE SCALE INTEGRATION

(75) Inventors: Kie Y. Ahn, Chapapqua, NY (US); Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/044,097

(22) Filed: Jan. 11, 2002

(65) Prior Publication Data

US 2002/0106890 A1 Aug. 8, 2002

Related U.S. Application Data

(62) Division of application No. 09/777,816, filed on Feb. 5, 2001, now Pat. No. 6,451,685.

(51) Int. Cl.[7] .............................................. H01L 21/44
(52) U.S. Cl. ...................... 257/762; 257/768
(58) Field of Search ..................... 257/295, 750–769

(56) References Cited

U.S. PATENT DOCUMENTS

| | | | |
|---|---|---|---|
| 4,352,716 A | 10/1982 | Schaible et al. | 156/643 |
| 5,395,650 A | 3/1995 | Holl et al | 427/250 |
| 5,424,246 A | 6/1995 | Matsuo et al | 437/192 |
| 5,328,811 A | 7/1995 | Brestel | 430/325 |
| 5,459,098 A | 10/1995 | Maya | 437/173 |
| 5,686,789 A | 11/1997 | Schoenbach et al | 313/491 |
| 5,695,810 A | 12/1997 | Dubin et al | 427/96 |
| 5,736,002 A | 4/1998 | Allen et al | 156/628.1 |
| 5,744,376 A * | 4/1998 | Chan et al. | 438/74 |
| 5,925,415 A | 7/1999 | Fry et al | 427/304 |
| 5,993,679 A | 11/1999 | Koide et al | 216/74 |
| 6,249,055 B1 | 6/2001 | Dubin | 257/758 |
| 6,333,248 B1 | 12/2001 | Kishimoto | 438/586 |
| 6,348,125 B1 | 2/2002 | Geusic et al. | 156/345 |

FOREIGN PATENT DOCUMENTS

| | | |
|---|---|---|
| EP | 0 374 505 A2 | 6/1990 |
| JP | 2000-216160 | 8/2000 |
| WO | WO 98/53480 | 11/1998 |

OTHER PUBLICATIONS

Jain et el., "Thermal dry–etching of copper using hydrogen peroxide and hexafluoroacetylacetone," *Thin Solid Films* 268, 1995, pp. 51–56.

El–Habachi et al., "Emission of excimer radiation from direct current, high–pressure hollow cathode discharge," *Appl. Phys. Lett.*, vol. 72, Jan. 5, 1998, pp. 22–24.

El–Habachi et al., Generation of intense excimer radiation from high-pressure hollow cathode discharges," *Appl. Phys. Lett.*, vol. 73, no. 7, Aug. 17, 1998, pp. 885–887.

(List continued on next page.)

*Primary Examiner*—Jey Tsai
(74) *Attorney, Agent, or Firm*—Dorsey & Whitney LLP

(57) ABSTRACT

A method of manufacturing integrated circuits using a thin metal oxide film as a seed layer for building multilevel interconnects structures in integrated circuits. Thin layer metal oxide films are deposited on a wafer, and standard optical lithography is used to expose the metal oxide film in a pattern corresponding to a metal line pattern. The metal oxide film is converted to a layer of metal, and a metal film may then be deposited on the converted oxide film by either selective CVD or electroless plating. Via holes are then fabricated in a similar process using via hole lithography. The process is continued until the desired multilevel structure is fabricated.

12 Claims, 2 Drawing Sheets

OTHER PUBLICATIONS

Esrom et al., "VUV light induced deposition of palladium using an incoherent $Xe_2^*$ excimer source," *Chemtronics*, vol. 4, September 1989, pp. 202–208.

Fleisch et al., "An XPS Study of the UV Photoreduction of Transition and Noble Metal Oxides," *Applied Surface Science*, vol. 26, 1986, pp. 51–62.

Fleisch et al., "Reduction of Copper Oxides by UV Radiation and Atomic Hydrogen Studied by XPS," *Applications of Surface Science*, vol. 10, 1982, pp. 51–62.

Frame et al., "Microdischarge devices fabricated in silicon in silicon," *Appl. Phys. Lett.*, vol. 7, no. 9, Sep. 1, 1997, pp. 1165–1167.

Kaloyeros et al., "Chemical Vapor Deposition of Copper for Multilevel Metallization," *MRS Bulletin*, vol. 18, no. 6, June 1993, pp. 22–29.

Kang et al., "Dry etching of copper film with hexafluoroacetylacetone via oxidation process," *J. Vac. Sci. Technol. B.*, vol. 17, no. 1, Jan/Feb 1999, pp. 154–157.

Kogelschatz, "Silent–discharge driven excimer UV sources and their applications," *Applied Surface Science*, vol. 54, 1992, pp. 410–423.

Lakshmanan et al., "A novel model of hydrogen plasma assisted chemical vapor deposition of copper," *Thin Solid Films 338*, 1999, pp. 24–39.

Lopatin et al., "Thin Electroless Barrier for Copper Films," *Part of the SPIE Conference on Multilevel Interconnect Technology II*, vol. 3508, September 1998, pp. 65–77.

Musil et al., "Microwave Plasma Enhanced Low Pressure D.C. Sputtering of Copper Films," *Czechoslovak Journal of Physics*, vol. 46, no. 4, 1996, pp.353–368.

Pal et al., "Electrical properties of vacuum–evaporated copper films," *Thin Solid Films 25*, 1975, pp. S25–S28.

Ryan et al., "Copper Interconnects for Advanced Logic adn DRAM," *Extended Abstracts of the 1998 International Conference on Solid State Devices and Materials*, Hiroshima, 1998, pp. 258–259.

Schoenbach et el., "Microhollow cathode discharges," *Appl. Phys. Lett.*, vol. 68, no. 1, Jan. 1, 1996, pp.13–15.

Shacham–Diamand et al., "High aspect ratio quarter–micron electroless copper integrated technology," *Microelectronic Engineering*, vol. 37/38, 1997,pp. 77–88.

Zhang et al., "Efficient excimer ultraviolet sources from a dielectric barrier discharge in rare–gas/halogen mixtures," *J. Appl. Phys.*, vol. 80, no. 2, Jul. 15, 1996, pp. 633–638.

* cited by examiner

MULTILEVEL COPPER INTERCONNECTS FOR ULTRA LARGE SCALE INTEGRATION

CROSS-REFERENCE TO RELATED APPLICATION

This application is a divisional of U.S. patent application Ser. No. 09/777,816, filed Feb. 5, 2001, U.S. Pat. No. 6,451,685.

TECHNICAL FIELD

The present invention relates to the manufacturing of integrated circuits. In particular, this invention relates to using a thin copper oxide film as a seed layer for building multilevel interconnects structures in integrated circuits.

BACKGROUND OF THE INVENTION

The rapid progress in miniaturization of integrated circuits (IC) is leading to denser and finer pitched chips with ever increasing performance. In order to enhance the performance of advanced ICs, interconnect systems are gradually migrating away from aluminum thin films to copper thin films. As compared to aluminum, a traditionally used material, copper has more advantages, which are critical for improving integrated circuit performance. First, copper has a much lower sheet resistivity than aluminum. Thus, for carrying the same amount of current, a copper line can be made narrower and thinner than an aluminum one. Therefore, using a copper line allows for higher integration density. Also, narrower and thinner conductive lines decrease both inter-level and inter-line capacitance, which leads to higher speed and less bleed over for the circuit. Lastly, copper has a better electromigration resistance than aluminum. Accordingly, as metal lines are made thinner and circuitry becomes more densely packed, copper provides higher reliability when used in ICs.

Of the several methods proposed for fabricating copper interconnects, the most promising method appears to be the Damascene process. In using this method, the trenches and vias are formed in blanket dielectrics, and then a metal is deposited into the trenches and holes in one step, which is then followed by chemical mechanical planarization (CMP) to remove the unwanted surface metal. This leaves the desired metal in the trenches and holes, and a planarized surface for subsequent processsing.

However, during the aforementioned CMP process, especially for the vias, more than ninety-nine percent of the deposited copper is removed. In terms of copper alone, this is very wasteful and expensive. In addition, manufacturing consumables, such as pads and slurries are excessively consumed during the CMP process. The disposal of these manufacturing by-products is of sufficient environmental concern to warrant a more viable method. Therefore, it is highly desirable to accomplish the copper metallization without CMP. A selective copper deposition by electroless plating or chemical vaporization deposition (CVD) offers a "CMP-less" metallization technology. For example, one such method of fabricating multilayer interconnect structures using electroless selectively deposited copper is described in a previously co-pending application entitled "A SELECTIVE ELECTROLESS-PLATED MULTILAYER COPPER METALLIZATION FOR ULSI," Micron Docket No. 99-0715, which is incorporated herein by reference. In that method, a very thin film of Pd or Cu, forms an "island structure" or a barely continuous thin film in the thickness range of 3–10 nm.

SUMMARY OF THE INVENTION

In one aspect of the invention, multilevel copper interconnects, including metal lines and via holes, are fabricated on a wafer. Initially, a thin seed layer of copper oxide is deposited over the wafer. After defining the metal line pattern by standard optical lithography, the exposed copper oxide is converted to copper using an ultra-violet photo reduction method. Afterwards, a copper film is deposited using electroless plating or chemical vaporization deposition (CVD) and a planar surface is thereby provided. In the next step, via holes are fabricated using conventional methods such as via hole lithography, and a second layer of copper oxide is deposited in a manner similar to the first. As with the first copper layer, a planar surface is provided for subsequent layers.

As a result, multilevel interconnect structures with as many metal layers as desired can be manufactured by repeating the process, and without the need for CMP. One key advantage of using copper oxide in lieu of copper as the seed layer is the potentially high manufacturing yield in ICs. If a pure copper seed layer is used, a native copper oxide may form on the surface of the wafer depending upon how long the wafer is exposed to the air. This makes reproducibility an issue unless an additional step of removing the copper oxide is performed.

DETAILED DESCRIPTION OF THE INVENTION

In accordance with the exemplary method of the present invention, a method of fabricating multilevel copper interconnects for Ultra Large Scale Integration (ULSI) will be described. It is proposed to use a thin copper oxide film as the seed layer to fabricate the desired multilayer interconnect structure. Previously, the fabrication of electrolessly deposited copper lines using copper oxide as the seed layer was described in co-assigned patent applications entitled "CONDUCTIVE MATERIAL PATTERNING METHODS," Micron Docket No. 99-0671 and "REMOVAL OF COPPER OXIDES FROM INTGRATED INTERCONNECTS," U.S. patent application No. 09/484, 683, which are incorporated herein by reference.

The embodiments, offered not to limit but only to exemplify and teach concepts of the invention, are shown and described in sufficient detail to enable those skilled in the art to implement or practice the invention. Thus, where appropriate to avoid obscuring the invention, the description may omit certain information known to those of skill in the art.

Figure 1:
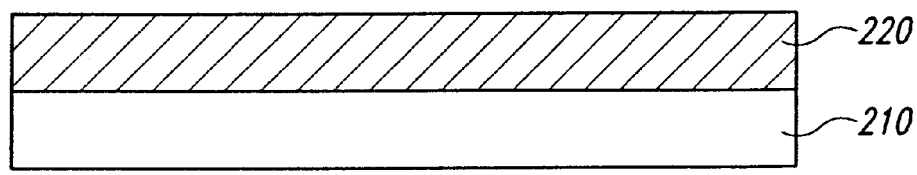
FIGS. 1–5 are cross-sectional views illustrating the exemplary method for manufacturing multilevel metal interconnects for ultra large-scale integration.

FIGS. 1–5 show a number of cross-sectional views, which taken collectively and sequentially, illustrate an exemplary method of making multilevel interconnects for ULSI. As shown in FIG. 1, the method begins with a semiconductor wafer 210. It can be appreciated that the semiconductor wafer 210 may be at any stage of fabrication. A thin layer of a copper oxide 220, in the thickness range of 10 to 30 nm, is deposited on the surface of the semiconductor wafer 210. While copper and copper oxide are disclosed herein to fabricate multilevel interconnects, it can be appreciated that other metals and their oxides, such as platinum and palladium, for example, are also well suited for use in the disclosed method.

In the exemplary embodiment, various techniques can be used for depositing the copper oxide layer 220, including, but not limited to, CVD, ionized-magnetron sputtering technique, DC magnetron self-sputtering technique, plasma evaporation, plasma-enhance CVD, metalorganic microwave plasma CVD, CVD from copper dipivaloymethanate, and pulsed laser deposition.

For example, V. F. Drobny et al reported in *Thin Solid Films*, Vol. 61, No. 1, 89–98 (1979), that reactive sputtering in oxygen-argon mixtures produced thin copper oxide films with a range of properties which was controlled by varying the partial pressure of oxygen in the discharge, and which is incorporated herein by reference. More recently, A. Parretta et al, in *Physica Status Solidi A*, Vol. 155, No. 2, 399–404 (1996), which is incorporated herein by reference, studied the electrical and optical properties of copper oxide films prepared by reactive RF magnetron sputtering, and concluded that single phase $Cu_2O$ and CuO can be obtained by controlling the oxygen partial pressure. Parretta found that the typical resistivity of $Cu_2O$ films was 43 ohm-cm, which are at least six orders of magnitude higher than pure copper.

In another technique, as reported by K. Santra et al in *Thin Solid Films*, Vol. 213, No. 2, 226–9 (1992), which is incorporated herein by reference, copper oxide films were deposited on substrates by evaporating metallic copper through a plasma discharge in the presence of a constant oxygen pressure. The "as deposited" cuprous oxide changed phase after annealing to cupric oxide. Also, as reported by H. Holzsuch et al in Applied Physics A, Vol.A51, No. 6, 486–90 (1990), which is incorporated herein by reference, copper oxide films were deposited by enhanced CVD using copper acetylacetone as a precursor. Holzsuch found that an increase of the substrate temperature changes the phases of deposit from $Cu_2O+CuO$ to Cu. At temperatures greater than 500° C., the deposition rates were high, but the films were mainly metallic copper. Also, B. Wisniesky et al introduced in *Journal de Physique*, Vol. 1, No. C2, 389–95 (1991), which is incorporated herein by reference, a microwave enhanced CVD as an innovative technique to allow direct preparation at low temperature of different valance states of copper using a volatile metalorganic precursor of copper acetylacetonate. Note however, that a judicious choice of the process parameters, such as microwave power, substrate temperature, and the mixture of oxidant gas, $N_2O$ or O, allowed the formation of metallic copper, $Cu_2O$, or CuO.

In another method reported recently by T. Mruyama in *Solar Energy Materials and Solar Cells*, Vol. 56, No. 1, 85–92 (1998), and incorporated herein by reference, polycrystalline copper oxide thin films were prepared from copper dipivaloymethanate and oxygen by an atmospheric-pressure CVD method. Even more recently, Y. Matsuura et al reported in *Applied Optics*, Vol. 38, No. 9, 1700–3 (1999), and also incorporated herein by reference, that a dielectric film of copper oxide was deposited on the inside of a Ag-coated glass capillary by use of metal acetylacetonate as the precursor in the CVD process. The copper oxide deposit was found to be highly resistant to chemicals and heat.

Finally, two other methods for depositing the copper oxide are also incorporated herein by reference. M. Shurr et al recently reported in *Thin Solid Films*, Vol. 342, No. 1–2, 266–9 (1999), that ultra-thin films of CuO have been prepared from Langmuir-Blodgett (L-B) multilayer films using an organic precursor, and where the L-B multilayer films consisted of Cu-arachidate, and the organic component was removed either by thermo-desorption or UV desorption. Another technique for growing copper oxide films was reported by R. Leuchtner et al, in *Epitaxial Oxide Thin Films II*, Materials Research Society Symposium Proceedings, Vol. 401, 551–56 (1995). Here, the copper oxide films were grown using a pulsed laser deposition (PLD) method with either copper metal or a copper oxide target. Under certain conditions, epitaxial CuO films were obtained at 450° C.

Figure 2:
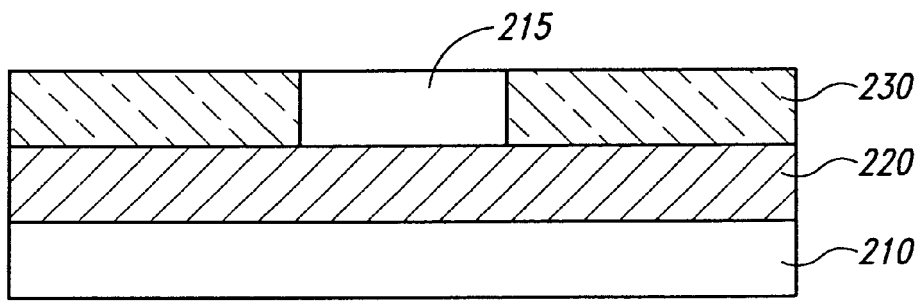
Figure 3:
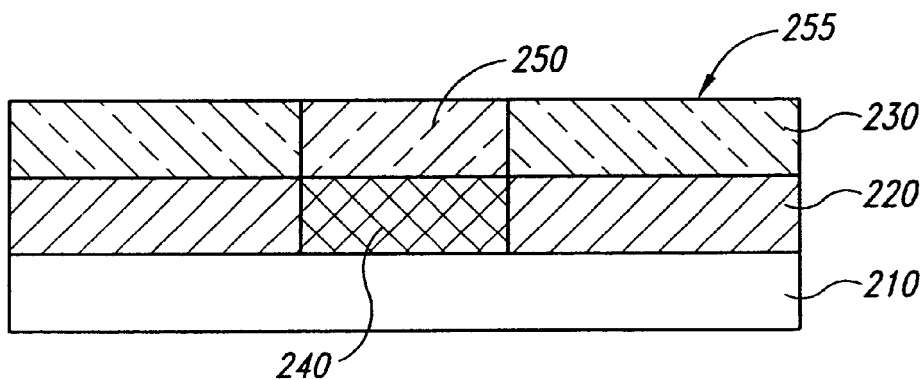

Referring to FIG. 2, after depositing the thin layer of copper oxide 220 on the wafer 210 as outlined above, a metal line pattern 215 is defined by standard optical lithography using a first photoresist layer 230. The thickness of the photoresist layer 230 is carefully chosen to match that of the metal line 215. Referring to FIG. 3, the exposed copper oxide 220 is then converted to a copper layer 240 in-situ by UV photo-reduction according to conventional or hereinafter developed processes, including, for example, the method described in co-pending and co-assigned patent application entitled "CONDUCTIVE MATERIAL PATTERNING METHODS," Micron Docket No. 99-0671, which is incorporated herein by reference. A copper film 250 is deposited selectively to a desired thickness by either selective CVD or electroless plating. After these steps, a planar surface 255 is provided for subsequent steps without CMP.

Figure 4:
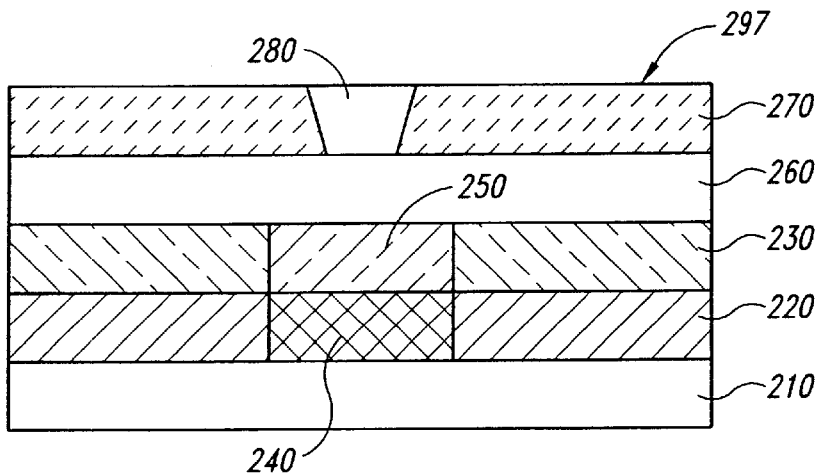
Figure 5:
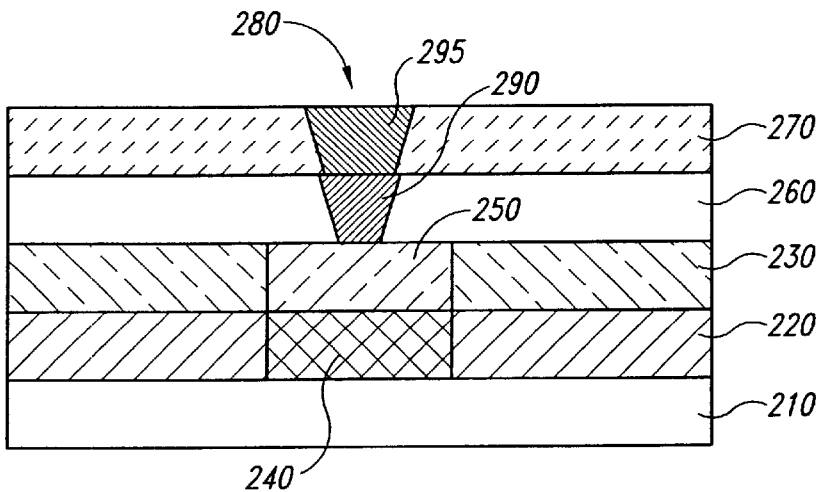

As shown in FIG. 4, a via hole 280 may also be fabricated. A second seed layer of copper oxide 260 is deposited over the first photoresist layer 230 and the copper layer 250 in a manner similar to depositing the first layer of copper oxide 220, as discussed above. Next, via hole lithography is performed using a photo resist layer 270 having a thickness corresponding to the length of a via 280. Referring now to FIG. 5, the exposed copper oxide 290 is converted to copper in-situ by UV photo-reduction, as described above. A copper film 295 is selectively deposited to a desired thickness by either selective CVD or electroless plating. Again, the thickness of the second photoresist layer 270 is carefully chosen to match that of the via 280. As before, after these steps, a planar surface 297 is provided for the subsequent steps without CMP.

By repeating the foregoing process in any order, as many layers as desired can be fabricated to develop multilevel interconnect structures.

Figure 6:
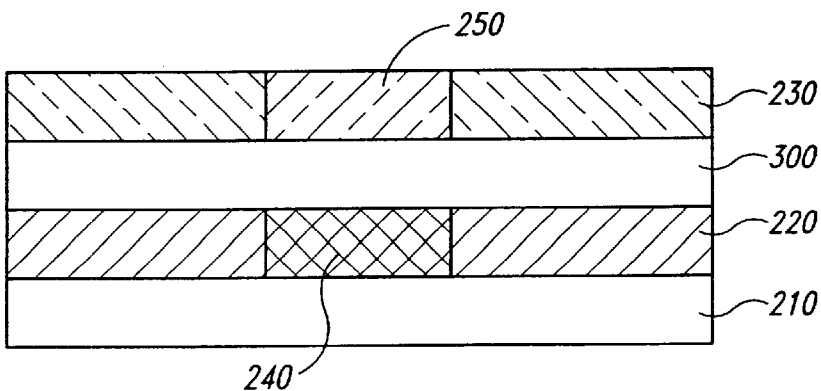
FIG. 6 is a cross-sectional view of an alternate embodiment of the invention.

In an alternate embodiment as shown in FIG. 6, the foregoing process can be combined with an insulation layer 300 between the copper oxide layer 220 and the first photoresist layer 230. The insulation layer 300 could be comprised of $SiO_2$ or an equivalent material that does not transmit UV light during the first photo reduction step outlined above.

For applications in high-performance packaging, after the foregoing steps, the used layers of the photoresist, 230 and 270, may be left and used as a low-dielectric constant insulation layer. Also, the seed layers of copper oxide, 220 and 260, having high-resistivity and are therefore in themselves almost insulating, may be left in place since the current leakage between lines, assuming a line spacing of greater than 10 microns, will be significantly lower than the signals.

For applications in ULSI chips, the used photoresist layers are removed by oxygen plasma ashing, and the used copper oxide seed layers, 220 and 250, are removed by etching as described in Wisiniewsky et al above. Employing this method leaves a finished air-bridge structure which can then be passivated with materials and methods described in a co-pending and co-assigned patent application entitled "METHODS AND APPARATUS FOR MAKING A COP- PER WIRING IN INTEGRATED CIRCUITS," U.S. patent application Ser. No. 09/484,303, which is incorporated herein by reference. If desired, the air space can be filled in one operation with a suitable dielectric layer.

In the exemplary method described above, it is assumed that the IC chips are designed so that there are no unsupported long lines. For longer lines, which may sag during processing due to their weight, the procedure described in U.S. Pat. No. 5,891,797 and incorporated herein by reference, should be considered. There is a limit on the width of copper wiring lines on the upper levels of wiring since wide lines are decomposed into several lines of near minimum width and spacing, and this will ensure sufficient spaces in the structure to enable removal of the photoresist on lower levels and an open air-bridge structure.

In summary, what is disclosed is a novel method of fabricating multilayer copper interconnects structures using selective deposition of copper with copper oxide seed layers. Many wasteful steps of CMP are eliminated and simplified, and robust fabrication steps are introduced for high-performance packaging and USLI chips.

While various embodiments of the invention have been illustrated and described in detail herein, it will be apparent that changes and additions may be made therein and hereto without departing from the spirit of the invention, and which are encompassed within the spirit of the invention and the scope of the appended claims.

What is claimed is:

1. A multi-layered integrated circuit, which comprises:
   at least one or more integrated devices;
   a first insulating layer of a metal oxide contacting the respective one or more integrated devices, and formed by depositing a metal oxide layer on the device; and
   a metal layer formed by converting one or more portions of the metal oxide layer to one or more converted portions of metal while at least other portions of the metal oxide remain, and depositing a layer of metal thereon.

2. The multi-layered integrated circuit of claim 1, wherein the metal is copper and the metal oxide is copper oxide.

3. The multi-layered integrated circuit of claim 1, wherein the metal is platinum and the metal oxide is platinum oxide.

4. The multi-layered integrated circuit of claim 1, wherein the metal is palladium and the metal oxide is palladium oxide.

5. A multi-layered integrated circuit which comprises:
   at least one or more integrated devices;
   a first insulating layer of a metal oxide contacting the respective one or more integrated devices formed by depositing a metal oxide layer on the device;
   a first metal layer formed by converting one or more portions of the metal oxide layer to one or more converted portions of metal while at least other portions of the metal oxide remain, and depositing a layer of metal thereon;
   a second insulating layer of metal oxide contacting the respective first metal layer, and formed by depositing a second metal oxide layer on the first metal layer; and
   a second metal layer formed by converting one or more portions of the second metal oxide layer to one or more converted portions of metal while at least other portions of the metal oxide remain, and by depositing a layer of metal thereon.

6. The multi-layered integrated circuit of claim 5, wherein the metal is copper and the metal oxide is copper oxide.

7. The multi-layered integrated circuit of claim 5, wherein the metal is platinum and the metal oxide is platinum oxide.

8. The multi-layered integrated circuit of claim 5, wherein the metal is palladium and the metal oxide is palladium oxide.

9. A multi-layered integrated circuit, which comprises:
   at least one or more integrated devices;
   a first insulating layer of a metal oxide contacting the respective one or more integrated devices and formed by depositing a metal oxide layer on the device;
   a first metal layer formed by converting one or more portions of the metal oxide layer to one or more converted portions of metal while at least other portions of the metal oxide remain, and depositing a layer of metal thereon;
   a second insulating layer of metal oxide contacting the respective first metal layer, and formed by depositing a second metal oxide layer on the first metal layer;
   a second metal layer formed by converting one or more portions of the second metal oxide layer to one or more converted portions of metal while at least other portions of the metal oxide remain, and by depositing a layer of metal thereon;
   a third insulating layer of metal oxide contacting the respective second metal layer, and formed by depositing a third metal oxide layer on the second metal layer; and
   a third metal layer formed by converting one or more portions of the third metal oxide layer to one or more converted portions of metal while at least other portions of the metal oxide remain, and by depositing a layer of metal thereon.

10. The multi-layered integrated circuit of claim 9, wherein the metal is copper and the metal oxide is copper oxide.

11. The multi-layered integrated circuit of claim 9, wherein the metal is platinum and the metal oxide is platinum oxide.

12. The multi-layered integrated circuit of claim 9, wherein the metal is palladium and the metal oxide is palladium oxide.

* * * * *